(12) United States Patent
Kunze et al.

(10) Patent No.: US 6,433,545 B1
(45) Date of Patent: Aug. 13, 2002

(54) METHOD FOR EVALUATING SIGNALS OF MAGNETORESISTIVE SENSORS WITH HIGH BAND WIDTH

(75) Inventors: Jürgen Kunze, Wetzlar; Gunter Schepp, Langgöns-berklen; Fritz Dettmann, Sinn; Uwe Loreit, Wetzlar, all of (DE)

(73) Assignee: Lust Antriebstechnik GmbH, Lahnau (DE)

( * ) Notice: Subject to any disclaimer, the term of this patent is extended or adjusted under 35 U.S.C. 154(b) by 0 days.

(21) Appl. No.: 09/744,570
(22) PCT Filed: Jul. 22, 1999
(86) PCT No.: PCT/EP99/05233
§ 371 (c)(1), (2), (4) Date: Jan. 26, 2001
(87) PCT Pub. No.: WO00/07033
PCT Pub. Date: Feb. 10, 2000

(30) Foreign Application Priority Data

Jul. 29, 1998 (DE) .......................... 198 34 153

(51) Int. Cl.⁷ .............. G01B 7/14; G01B 7/30
(52) U.S. Cl. ................. 324/252; 324/207.21
(58) Field of Search .............. 324/252, 207.21, 324/225, 249, 250, 251, 255

(56) References Cited

U.S. PATENT DOCUMENTS 4,596,950 A   6/1986  Lienhard et al.
5,351,005 A * 9/1994  Rouse et al. ............ 324/252
5,747,997 A   5/1998  Dahlberg et al.
5,933,003 A * 8/1999  Hebing et al. .......... 324/117 R

FOREIGN PATENT DOCUMENTS

JP   04 191685   7/1992
WO   98 07165    2/1998

* cited by examiner

Primary Examiner—Edward Lefkowitz
Assistant Examiner—Subhash Zaveri
(74) Attorney, Agent, or Firm—Collard & Roe, P.C.

(57) ABSTRACT

The invention relates to a method for evaluating signals while eliminating an interference signal on magnetoresistive sensor elements which is preferably proportional to the zero offset. The sensor elements can form a sensor element array such as a sensor bridge. According to the invention, the direction of magnetization of the sensor elements is modulated or shifted by applying a magnetic pulse field of a modulated or variable direction, and the output signals of the sensor elements or of the sensor element array are fed to a differential amplifier. Due to the modulation or shift of the operating voltage of the sensor bridge, the modulation or shift resulting at the same time as the magnetization of the sensor elements, a signal often arises which includes a direct component that is proportional to the magnetic field to be measured, and has an alternating component that is proportional to the offset voltage of the sensor element array. The latter is minimized by a feedback or is adjusted to zero. The bandwidth, with which the direct voltage that is proportional to the magnetic field to be measured can follow changes of the input signal, is greater in magnitude than the magnetization frequency of the sensor elements.

12 Claims, 1 Drawing Sheet

METHOD FOR EVALUATING SIGNALS OF MAGNETORESISTIVE SENSORS WITH HIGH BAND WIDTH

CROSS REFERENCE TO RELATED APPLICATIONS

Figure 1:
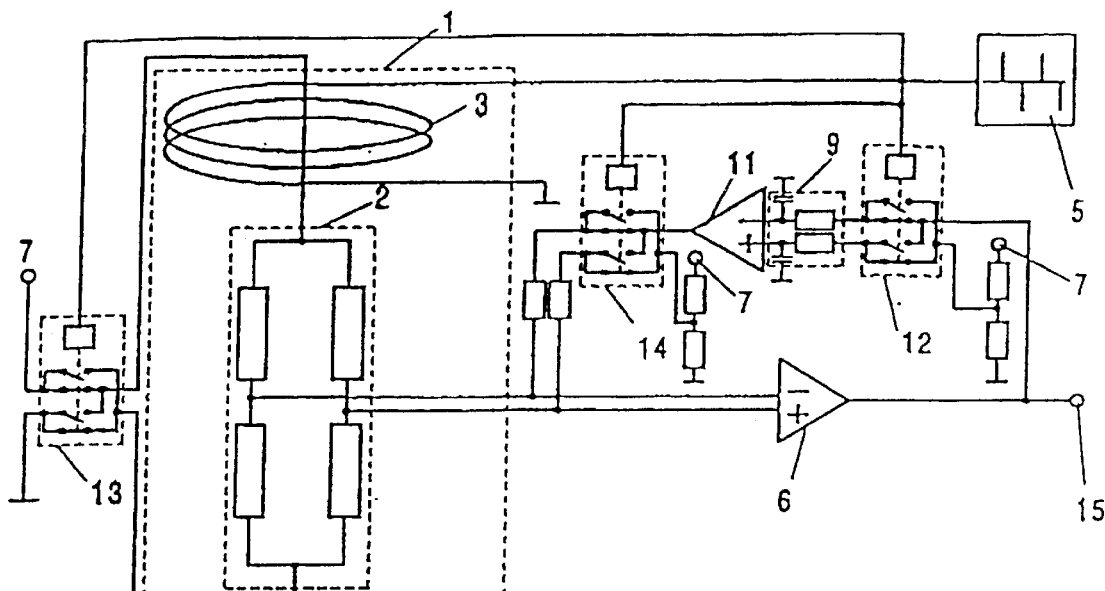

Applicants claim priority under 35 U.S.C. §119 of GERMAN Application No. 198 34 153.9 filed Jul. 29, 1998. Applicants also claim priority under 35 U.S.C. §120 of PCT/EPT99/05233 filed on Jul. 22, 1999. The international application under PCT article 21 (2) was not published in English.

The invention relates to a method and a number of devices for carrying out said method for evaluating the signals of magnetoresistive sensors, in connection with which for the purpose of eliminating an interference signal that is proportional to the zero offset, the magnetization of the magnetoresistive resistor strips is periodically adjusted or only modulated by flip current pulses alternating in the positive and negative directions by way of an integrated flip line or by an external flip coil. The magnetoresistive sensor can be employed in this connection for high-resolution measurements of a magnetic field or of a magnetic field gradient, or of values based thereon, for example for potential-free current measurements.

Measuring devices for measuring magnetic fields that employ such methods with the objective of separating the offset voltage caused in magnetoresistive sensor bridges by unevenness of the resistances and their temperature dependency, from the sensor signal that is proportional to the magnetic field, are already known. For example, laid-open patent specification DE-OS 34 42 278 describes a magnetic field measuring device that contains a magnetic field sensor with four sensor elements consisting of magnetoresistive layer strips with Barber pole structures. Said sensor elements are wired as a Wheatstone bridge and are fed by a direct current source. Owing to tolerances in the manufacture of the magnetoresistive layer strips, not all four bridge resistances are completely the same, and without the presence of a magnetic field to be measured, the offset voltage ensuing from the dc voltage value appears on the output of the sensor bridge. All of the magnetoresistive layer strips of the sensors each have in each case at the same time the same magnetically preferred direction ensuing from the direction of their respective magnetization. A magnetizing coil is arranged within the proximity of the sensor elements, which is supplied by a current pulse generator with short, alternating positive and negative current pulses. Said current pulses generate in the magnetizing coil an alternating magnetic field that reverses the magnetism of the magnetoresistive layer strips at the cycle of the flip current pulses. When a magnetic field to be measured is applied, an ac voltage appears on the zero branch of the sensor bridge in addition to the aforementioned dc offset voltage. Said ac voltage can be indicated by a phase-sensitive rectifier that is controlled by the current pulse generator. On the output, said rectifier has an integrator for eliminating the offset voltage contained as the ac voltage component. The output voltage of said integrator is proportional to the magnetic field associated with the magnetic field sensor as long as it lies within the linearity region of the magnetic field sensor.

An important drawback of the described measuring method consists in that magnetic fields can still be measured only with a maximal bandwidth amounting to about one hundredth up to about one tenth of the frequency of the flip current pulses because the offset voltage of the sensor bridge present in the signal as the alternating component downstream of the phase-sensitive rectifier is otherwise present in an excessive proportionate amount. A second drawback of the measuring method is conditioned by the limited linearity range of the characteristic of the sensor bridge, as well as by the temperature dependency of the gradient of the characteristic as well as its dependency on the component of the magnetic field acting in the longitudinal direction of the magnetoresistive layer strips. This leads to the fact that the proportionality of the output voltage of the described measuring circuit to the measured component of the magnetic field is available only within a highly limited range of the field intensity and only at a constant temperature and constant magnetic field component in the longitudinal direction of the strips.

Said second drawback is already no longer present in connection with an improved measuring method according to U.S. Pat. No. 5,351,005. In the circuit specified in said patent specification, a current is generated by phase-sensitive rectification that is proportional to the magnetic field intensity to be measured. Said current is fed into a compensating coil in which the magnetoresistive sensor bridge is located, and generates there a magnetic field. The circuit controls said current to a value that generates in the coil a magnetic field that just about cancels the magnetic field applied from the outside. The magnetoresistive sensor bridge still acts here only as a zero instrument. The nonlinearities of the characteristic and their dependency on the temperature and the corresponding magnetic field component no longer play any role here. The output signal of the circuit is obtained, for example from a voltage drop that is generated by the current through the compensating coil on a fixed resistor. Two "sample and hold" amplifiers are alternately employed, controlled at the cycle of the flip current generator, for measuring the respective voltage drop for the two directions of magnetization in the magnetoresistive sensor. The difference between the two voltages of the "sample and hold" amplifiers, which is formed by a low-pass amplifier, still contains only the component of the signal that is proportional to the magnetic field, whereas the component that is proportional to the offset of the sensor bridge drops out due to the formation of the difference. The bandwidth with which magnetic fields can be measured based on the circuit described herein is substantially determined by the bandwidth of the low-pass amplifier. In the most favorable case it is possible to reach a bandwidth of half of the frequency of the flip current pulses because for obtaining the correct value of the magnetic field it is necessary that both "sample and hold" amplifiers each have picked up at least one measured value. Another circuit for eliminating the bridge offset resulting from the sensor signal is specified in the "Data Handbook SC 17" [1997] of Philips Semiconductors, page 36. In the present case, the bridge signal is first supplied to a differential amplifier. The dc voltage component of the signal downstream of the differential amplifier, which contains the offset voltage of the sensor bridge and the differential amplifier, is fed back negative to the input of the differential amplifier via a low-pass filter and is thus controlled to zero. The ac voltage component of the signal that is proportional to the magnetic field to be measured is rectified via a controlled amplifier. The rectified signal is fed as current into a compensating coil and cancels there the magnetic field to be measured. A filter is connected downstream because the jump-like change of the input voltage of the controlled amplifier by the normal deviation leads to voltage peaks at its output. This means that in the present case, too, the magnetic field can be measured only with a bandwidth that is far below the flip frequency.

The known methods proposed heretofore for eliminating the zero offset of the magnetoresistive bridge circuits all relate to those bridges whose resistor strips are provided with Barber pole structures, and whose magnetization can be adjusted in the positive or negative longitudinal direction by means of a dc or pulse field. The direction of the magnetic fields used in this connection substantially correspond with the light direction of the magnetoresistive resistor strips. The direction of the field to be measured extends perpendicular thereto in the heavy direction of the strips. However, patent specification U.S. Pat. No. 4,596,950 describes a magnetoresistive bridge that consists of four thin-layer strips made of anisotropic magnetoresistive material which do not carry any Barber pole structure. The cresistance of such thin-layer strips is quadratically dependent upon the intensity of the magnetic field in the heavy direction. Therefore, without application of a magnetic field, no field sensitivity is present with low field intensities unless an auxiliary magnetic field is applied to the thin-layer strips in the heavy direction for adjusting a working point. According to patent specification U.S. Pat. No. 4,596,950, said auxiliary magnetic field is jointly generated by the operating current of the bridge because the thin-layer strips forming the bridge resistors are arranged either in pairs one on top of the other, or a thin-layer line generating a magnetic field is present via the magnetoresistive thin-layer strips, with the operating current flowing through said thin-layer line. It is proposed in said patent specification to feed the bridge voltage to an ac voltage amplifier and to supply the output of the latter to a low-pass whose output signal is transmitted to an amplifier, and whose output current generates in a coil a magnetic field that compensates the field to be measured. The polarity of the operating current of the bridge has to be periodically changed in time for that purpose. The voltage drop caused on a known resistor by the compensating current is used as the output signal. Due to the simultaneous reversal of the direction of the operating current and the working point of the magnetoresistive tin-layer strips adjusted in that way, the output signal of not depending on the offset of the bridge.

The measuring arrangement proposed by said patent has the following drawbacks: The measurement is possible only up to an upper frequency limit that is below the limit frequency of the low-pass. Said limit frequency, however, may, at the most, come to about one tenth of the frequency at which the polarity of the operating current is changed. Furthermore, for adjusting the working point of the magnetoresistive thin-layer strips, permanently applied fields in the range of about 1 kA/m are required. Fields of that size can be realized in the described arrangements only with currents of a few 10 mA. Since the converted dissipation of a bridge has to be limited to about 0.1 watt at the most, only low bridge resistances can be used. This also limits the bridge voltages, specifically to a few tenths of one volt. The measuring sensitivity is highly restricted in that way, namely to about one hundredth of the value of a magnetoresistive bridge without correction of the offset voltage error. However, since the ratio of sensitivity to offset error needs to be as large as possible, only a minor improvement can be expected in this case.

As compared to the measuring methods specified above, which reverse the direction of the magnetization of Barber pole-structured magnetoresistive thin-layer strips with magnetic field pulses with alternating signs in the light direction, it has to be noted that the magnetic field pulse have to be applied only for a duration of less than one microsecond. This means that no restriction of sensitivity-conditioning parameters by electrical dissipation is existing in the present case.

Now, the problem of the invention is to propose a method for evaluating signals of magnetoresistive sensor elements with suppression of the bridge offset, whereby said sensor elements may form an array of sensor elements such as, for example a sensor bridge. With the method as defined by the invention, the direction of magnetization in the magnetoresistive sensor elements forming the resistors is periodically reversed by applying an alternating field, whereby the bandwidth of the evaluation method is not limited by the flip frequency employed for reversing the magnetism. Said problem is solved by the method that is described in the independent claim, and the method is further developed in specific ways as defined in the dependent claims.

The repeated reversing or modulating of the direction of magnetization in the magnetoresistive sensor elements addressed herein, which may be provided with Barber pole structures, by a magnetic pulse field with alternating directions, or with changing intensity; and by reversing the operating voltage of the sensor elements at the cycle of the magnetic pulse field, a signal is formed at the output of said sensor elements that is proportional to the magnetic field or magnetic field gradient acting on the sensor elements. Said signal is superposed by an alternating component with the offset signal as the amplitude. Said output signal is supplied to a differential amplifier, whereby in a simple exemplified embodiment of the invention, for example in an array of magnetoresistive sensor elements designed in the form of a Wheatstone bridge, the output voltage of the circuit is already available on the zero branch of the bridge as the measuring signal. For said output signal to no longer contain the alternating component conditioned by the offset, said alternating component is fed to the respective input of the differential amplified in a rectified and inphase form, so that it can be minimized by the differential amplifier, or theoretically even controlled to zero. For said purpose, the signal is transmitted from the output of the differential amplifier to a low-pass via a modulator or reversing switch controlled at the cycle of the magnetic pulse field, and then transmitted further via an amplifier to another modulator or reversing switch that is controlled at the cycle of the magnetic pulse field, said latter modulator or reversing switch establishing the connection to the respective input of the differential amplifier.

The low-pass in the feedback line may have a low limit frequency because offset changes in the sensor elements take place only at a relatively slow rate, for example due to changes in temperature, and are then nonetheless eliminated from the output signal by the control circuit. No provision is made for frequency-limiting stages in the actual signal path. This means that magnetic field changes to be measured are transmitted with high bandwidth as a change of the output voltage. Said bandwidth is not limited by the cycle frequency of the magnetic pulse field that serves for modulating or reversing the direction of magnetization of the magnetoresistive sensor elements, and is substantially greater than said frequency. The maximally transmittable frequency is limited by the fact that the magnetic field pulses for the above-described magnetization of the magnetoresistive layer strips must not fall short of a defined duration, and that during the change in magnetization, no change takes place in the resistance of the magnetoresistive layer strips that is proportional to the acting magnetic field.

According to a special, advantageous implementation of the method as defined by the invention, a proportional current is formed based on the output voltage of the differential amplifier and fed into a coil located within the proximity of the sensor bridge. At the site of the sensor bridge, the magnetic field of said current is directed against the magnetic field to be measured. The current is controlled by the circuit to a value that leads to cancellation of the magnetic field at the site of the sensor bridge. The offset voltage component at the output of the differential amplifier is controlled to zero in this process as described above, by rectification and inphase feedback to the input of the amplifier. The output signal of the circuit is, in the present case, the voltage drop that the current causes via a known resistor. Said drop in voltage is proportional to said output signal irrespectively of the temperature and of the quantity of the field to be measured, namely within a bandwidth that is not limited by the cycle frequency of the magnetic pulse field, but limited either by the duration of the magnetization-reversing pulse, or by the time constant of the control circuit for compensating the input signal.

According to another implementation of the invention, the cycle frequency at which the reversal or modulation of the magnetization of the magnetoresistive sensor elements takes place, and by which the reversing switches or modulators are controlled, is periodically varied in time. This serves the purpose of preventing conformity from developing over a longer period of time between the frequency of the magnetic field acting on the sensor bridge, and the cycle frequency. If the latter case were to occur, and, furthermore, if the point in time of the change in sign of the magnetic field corresponds with the point in time of the pulse reversing the magnetism, the voltage signals generated by the magnetic field and the voltage signals generated in the same phase by the offset voltage superpose one another. Due to the feedback on the differential amplifier, this would control to zero not only the offset component but also the signal component caused by the input signal, and a measurement would no longer be possible. However, if the cycle frequency of the magnetization reversal is varied within the duration of a period that is shorter than the time constant of the low-pass in the feedback branch of the differential amplifier, such breakdown in the measuring process is excluded at a defined frequency of the measuring signal.

The method as defined by the invention is particularly advantageous when sensor elements are employed that can form an array of sensor elements such as a sensor bridge whose bridge output signal is proportional to the acting magnetic field or to the acting magnetic field gradient if the sensor bridges already contain on the respective chip integrated thin-layer lines for the current for the magnetization and for the compensating current. Such sensors are described, for example in patent specifications U.S. Pat. No. 5,247,278 and U.S. Pat. No. 5,521,501. The thin-layer lines, which are used in said patents instead of coils for generating the respective magnetic fields, have substantially lower inductivities than the compact coils. For example, it is possible in connection with said patents to realize shorter pulses for reversing the magnetism, as well as lower control time constants for compensating the magnetic field to be measured. This makes the bandwidth of the signal processing especially large.

The invention is explained in greater detail in the following with the help of exemplified embodiments. In the associated drawing, FIG. 1 shows an arrangement for carrying out the method with the use of a magnetoresistive sensor bridge and a magnetizing coil, and FIG. 2 shows an arrangement for carrying out the method by employing a magnetoresistive sensor bridge, a magnetizing coil and a compensating coil.

Figure 2:
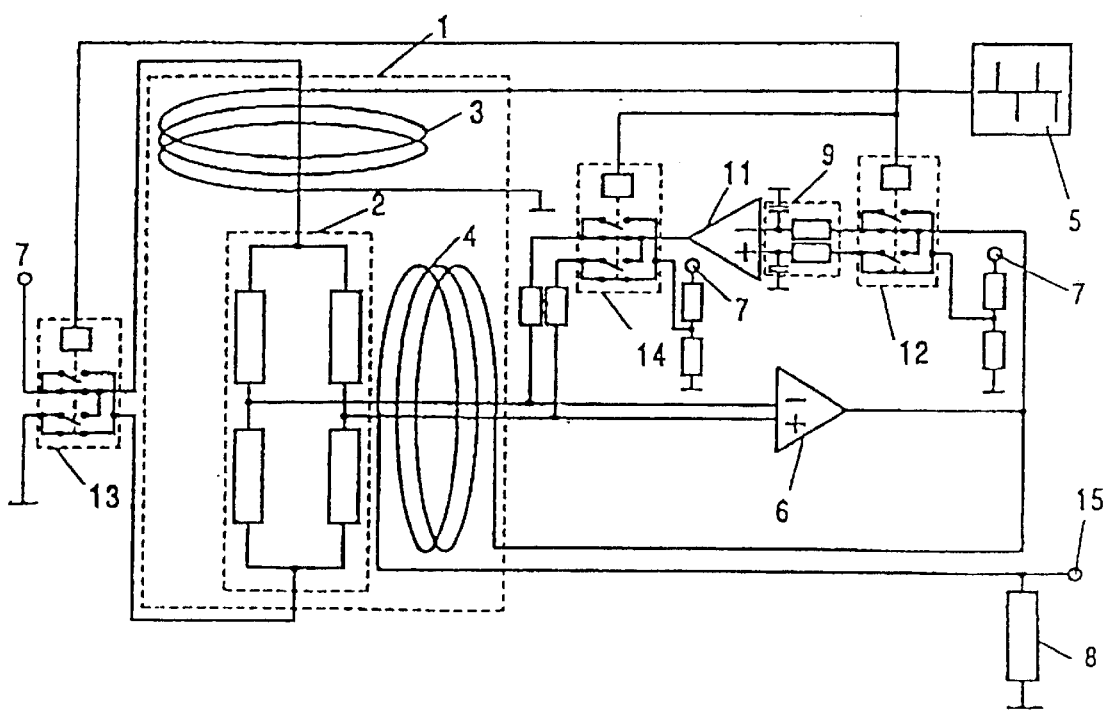

FIG. 1 contains a magnetoresistive sensor bridge 2. The operating voltage 7 of said sensor bridge is reversed by a reversing switch 13 at the same cycle as the one at which current pulses with alternating polarity are fed into a magnetism-reversing coil 3 from the current pulse generator 5. The sensor bridge 2 and the coil 3 reversing the magnetism are arranged integrated on a chip 1. By reversing the operating voltage 7 in the sensor bridge 7, the offset voltage on the bridge output becomes an ac voltage. The pulses of the current pulse generator 5 generate in the magnetism-reversing coil 3 magnetic field pulses that act on the resistors of the magnetoresistive sensor elements forming the sensor bridge 2, said sensor elements being designed in the form of layer strips applied by the thin-layer technology. The field intensity of the magnetic field pulse is sufficiently high for magnetizing the magnetoresistive layer strips in the respective direction. The magnetoresistive layer strips are provided with Barber pole structures, which, however, is not shown in the drawing. The gradient of the characteristic of the sensor bridge is preserved by the simultaneous reversal of the direction, or modulation of the magnetization in the layer strips and of the operating voltage of the bridge. When a magnetic field is acting on the sensor bridge 2, a dc voltage that is proportional to the magnetic field is thus generated on the bridge output. Said dc voltage is superimposed on the ac voltage conditioned by the offset voltage of the sensor bridge 2.

Said signal is amplified by the differential amplifier 6. The amplified signal is supplied to the reversing switch or modulator 12, which is controlled at the cycle of the current pulse generator 5 as well. The second input of the reversing switch or modulator 12 is applied to the output of a voltage divider with two identical resistors at half of the operating voltage 7. Downstream of the reversing switch 12, a signal is available that contains a dc component that is proportional to the offset voltage, and an alternating component that is proportional to the magnetic field. The alternating component is filtered out in the low-pass filter 9, which has a time constant that is large versus the pulse spacing of the current pulse generator 5. A voltage that is proportional to the offset voltage of the sensor bridge is thus present on the output of the amplifier 11. Said voltage is fed by the controlled reversing switch or modulator 12 into the input of the differential amplifier 6 in such a way that it counteracts the offset voltage present there. The offset component in the signal is minimized or even controlled to zero by such reverse feedback, so that only the voltage that is proportional to the magnetic field acting on the sensor bridge 2 is still present on the output 15 of the circuit. only the differential amplifier 6 is present in the actual signal path of the circuit between the sensor bridge 2 and the output 15 as a component limiting the frequency. Thus the changes in the output voltage are capable of following with high speed the changes in the magnetic field causing said changes of the output voltage. The transmittable bandwidth is not limited by the frequency of the pulse of the current pulse generator, but either by the bandwidth of the differential amplifier 6, or by the fact that a defined time duration is required for reversing the magnetism of the magnetorestrictive layer strips. In the course of such time duration, no proportionality exists between the acting magnetic field and the output voltage of the sensor bridge. Values have been determined for said time duration with the help of measurements that were clearly below one microsecond.

The following parameters are particularly advantageous in connection with said exemplified embodiment: pulses with alternating polarity with a length of 0.5 $\mu$s are used for reversing the magnetism. The pulse repetition frequency is wobbled between 1 kHz and 2 kHz, specifically at a wobbling frequency of 50 Hz. The differential amplifier 6 has a limit frequency of 1 MHz; the time constant of the low-pass 9 comes to about 1s. It is possible with such parameters to convert magnetic fields with a bandwidth of 1 MHz into proportional output voltages. The periodic change of the frequency of the pulses reversing the magnetism prevents conformity from existing over a longer period of time between the frequency and phase of the magnetism-reversing pulse, and possible frequency and phase of the magnetic field to be measured. Because of the high time constant of the low-pass 9, which is high in comparison to the duration of the wobble oscillations, all components caused by the magnetic field are in this way eliminated from the signal that has been fed back to the input of the differential amplifier 6. This means that only the offset voltage is cancelled in the present case, and the signal on the circuit output 15 contains all frequency components of the magnetic field up to the limit frequency.

FIG. 2 shows an arrangement for carrying out the method that corresponds in many parts with the arrangement of FIG. 1. Identical elements are therefore denoted by identical reference symbols. In the present arrangement, a compensating coil 4 is integrated on the sensor chip 1 in addition to the sensor bridge 2 and the magnetism-reversing coil 3. It has to be noted in this connection that neither the coil 3 for reversing the magnetism nor the compensating coil 4 need to have the design of a conventional coil. Rather preferred are often arrangements of thin-layer lines in whose proximity magnetic fields suitable for reversing the magnetism of the magnetoresistive layer strips, or for cancelling the magnetic field gradient to be measured, are generated in the presence of current through-flow. The gradient of the magnetic field or the magnetic field are generated in the present exemplified embodiment by a current whose value needs to be determined potential-free with the help of the method of the invention. The flip current pulse generator 5 supplies at the same time current pulses for the magnetism-reversing coil 3 and the reversing switch 13, the latter changing the polarity of the operating current of the sensor bridge 2. When the current to be measured flows within the proximity of the sensor bridge 2, it generates there a magnetic field gradient, and a dc voltage that is proportional to said gradient appears on the output of the sensor bridge 2. Said dc voltage is superposed by an alternating component that is conditioned by the zero offset of the sensor bridge 2. As described in connection with the first exemplified embodiment, the alternating component—which is proportional to the offset—is minimized by the feedback via the differential amplifier 6, and even controlled to zero, theoretically speaking. On its output, the differential amplifier 5 generates in this way an output current that is proportional to the current to be measured. Said output current is fed into the compensating coil and generates there a magnetic field that just about cancels in the site of the sensor bridge the magnetic field gradient generated by the current to be measured. A voltage that is proportional to the compensating current and thus to the current to be measured appears on the output 15 of the circuit via the resistor 8. Since the magnetoresistive sensor bridge 2 is acting in the present case only as a zero detector for the compensation, no role is played here by the non-linearity, the dependency on temperature and the dependency of the magnetic field on the sensor characteristic. The bandwidth with which the voltage on the output 15 of the circuit is capable of following the changes of the current to be measured, is determined by the time constant of the compensation control circuit. When using existing differential amplifiers and low-induction compensating coils 4 of the thin-layer type integrated on the chip, the bandwidth is in the megahertz range, whereas the frequency of the current pulse generator amounts to a few kilocycles.

List of Reference Numerals

1 Chip
2 Magnetoresistive sensor element array, e.g. sensor bridge
3 Magnetizing or magnetism-reversing coil
4 Compensation conductor or compensating coil
5 Current pulse generator
6 Differential amplifier
7 Operating voltage particularly of a sensor bridge
8 Shunt resistor
9 Low-pass
10 Current conductor
11 Amplifier
12 Reversing switch or modulator
13 Reversing switch or modulator
14 Reversing switch or modulator
15 Output

What is claimed is:

1. A method for evaluating signals with elimination of an interference signal proportional to the zero offset on a magnetoresistive sensor element, in which the directions of magnetization are reversed in said magnetoresistive sensor element having a Barber pole structure by application of a magnetic pulse field with an alternating direction, and an output voltage of said sensor element is fed to a differential amplifier, wherein the polarity of an operating voltage of said sensor element is changed at the cycle of said magnetic pulse field; that said output voltage of said sensor element is amplified by said differential amplifier and fed back to a low-pass via a reversing switch controlled at the cycle of said magnetic pulse field, and from the output of said low-pass fed back inphase to the input of said differential amplifier via an amplifier and a second reversing switch controlled at the cycle of said magnetic pulse field; and that the alternating component conditioned by the offset component of said output signal of said sensor element is controlled to zero in this way on the output of said differential amplifier.

2. The method according to claim 1, wherein a current proportional to said output signal of said differential amplifier is fed into a compensation conductor or a compensating coil located within the proximity of a sensor bridge; and that said magnetic field of said input signal to be measured is controlled to zero in this way at the site of said sensor elements.

3. The method according to claim 2, wherein said compensating current flowing through said compensation conductor or said compensating coil is directly used as said output signal of the circuit.

4. The method according to claim 3, wherein a voltage drop caused by a resistor connected in series with said compensation coil of said compensating circuit, is used as said output signal of the circuit.

5. The method according to claim 1, wherein the cycle frequency at which the magnetism of said magnetoresistive layer strips is reversed, and by which said reversing switches are controlled, is periodically varied in time.

6. The method according to claim 1, wherein a magnetoresistive sensor bridge is used for the measurement, with the output voltage of said sensor bridge being proportional to the magnetic field applied.

7. The method according to claim 1, wherein a magnetoresistive sensor bridge is used for the measurement, with the output voltage of said sensor bridge being proportional to a magnetic field gradient applied.

8. The method according to claim 1, wherein the magnetic field to be measured, or the magnetic field gradient to be measured are generated by a current.

9. A device for carrying out the method according to claim 1, wherein magnetoresistive sensor bridges are employed that contain in an integrated manner devices for generating a magnetism-reversing field.

10. A device for carrying out the method according to claim 1, wherein magnetoresistive sensor bridges are employed which contain in an integrated manner devices for generating a compensating field.

11. A device for carrying out the method according to claim 1, wherein at least a part of the electronics is integrated on a chip in the form of an application-specific integrated circuit (ASIC).

12. The device for carrying out the method according to claim 11, wherein said magnetoresistive sensor is integrated on the same chip.

* * * * *